United States Patent [19]

McDonough

[11] 4,015,328
[45] Apr. 5, 1977

[54] MULTILAYERED CIRCUIT ASSEMBLY INCLUDING AN EYELET FOR MAKING WELDABLE CONNECTIONS AND A METHOD OF MAKING SAID ASSEMBLY

[76] Inventor: Cletus G. McDonough, 200 Elm Tree Lane, Elmhurst, Ill. 60126

[22] Filed: June 2, 1975

[21] Appl. No.: 582,735

[52] U.S. Cl. .............................. 29/625; 174/68.5; 174/94 R; 339/17 M
[51] Int. Cl.² ......................................... H05K 1/04
[58] Field of Search ............ 174/68.5, 50.59, 94 R, 174/50.63; 317/101 B, 101 C, 101 CC, 101 CM; 339/17 R, 17 C, 17 F, 17 E, 220 R, 275 B, 17 M; 29/625, 626, 628; 24/141

[56] References Cited

UNITED STATES PATENTS

| | | | |
|---|---|---|---|
| 1,748,952 | 3/1930 | Gookin | 24/141 |
| 2,990,533 | 6/1961 | Hughes et al. | 339/220 R X |
| 3,171,519 | 3/1965 | Nolte | 174/50.63 |
| 3,277,347 | 10/1966 | Ecker | 339/17 E |
| 3,292,131 | 12/1966 | Porch | 339/275 B X |
| 3,446,908 | 5/1969 | Tally et al. | 174/68.5 |
| 3,537,176 | 11/1970 | Healy et al. | 29/625 |
| 3,728,573 | 4/1973 | Roeber | 174/50.59 |

*Primary Examiner* — Bruce A. Reynolds

[57] ABSTRACT

A method of making a multilayered circuit assembly from a plurality of flat, flexible circuit elements, wherein each circuit element includes a substrate having conductive means to define an electrical path of travel which is formed between a base layer made of insulation material and a cover layer made of insulation material. Each circuit element has a connecting station associated with the conductive means. The method generally includes the steps of forming the conductive means on the base layer of each circuit element, punching a first opening through the conductive means and base layer at a connecting station of each circuit element, soldering the connecting station of each circuit element so that a solid solder pad fills the first opening whereby the solder electrically contacts the conductive means, punching a second opening through the cover layer of each circuit element, securing the cover layer of each circuit element over the base layer and conductive means so that the first opening is generally concentric with the second opening, punching a third opening in each circuit element through the solder pad, stacking a plurality of punched and soldered circuit elements on top of one another so that the third openings are generally concentric, inserting a terminal into the third openings of the stacked circuit elements so that a portion thereof contacts the solder, and staking the terminal so that the other surface thereof forms a cold weld interference fit against the solder.

4 Claims, 15 Drawing Figures

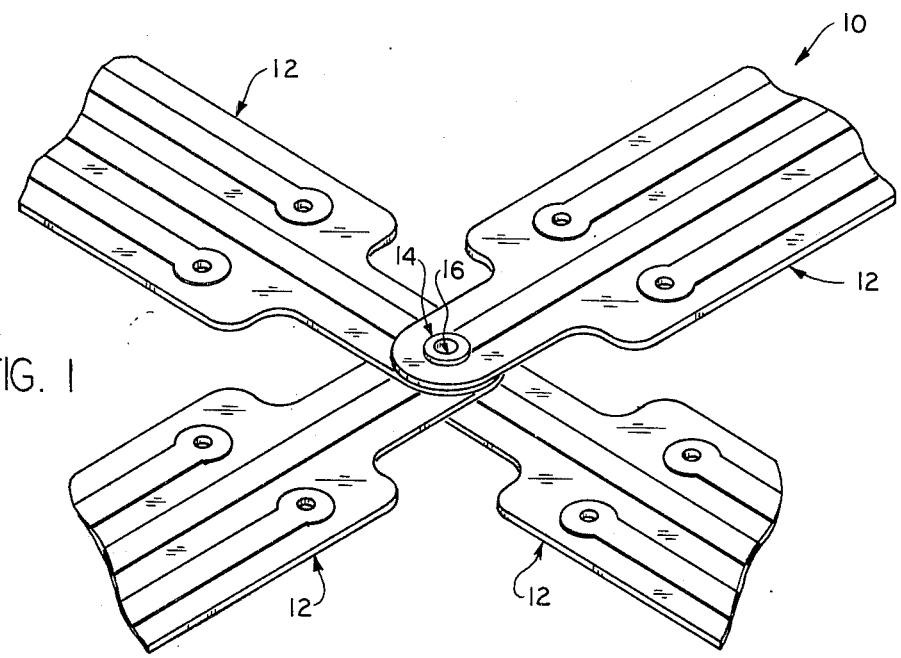
FIG. 1
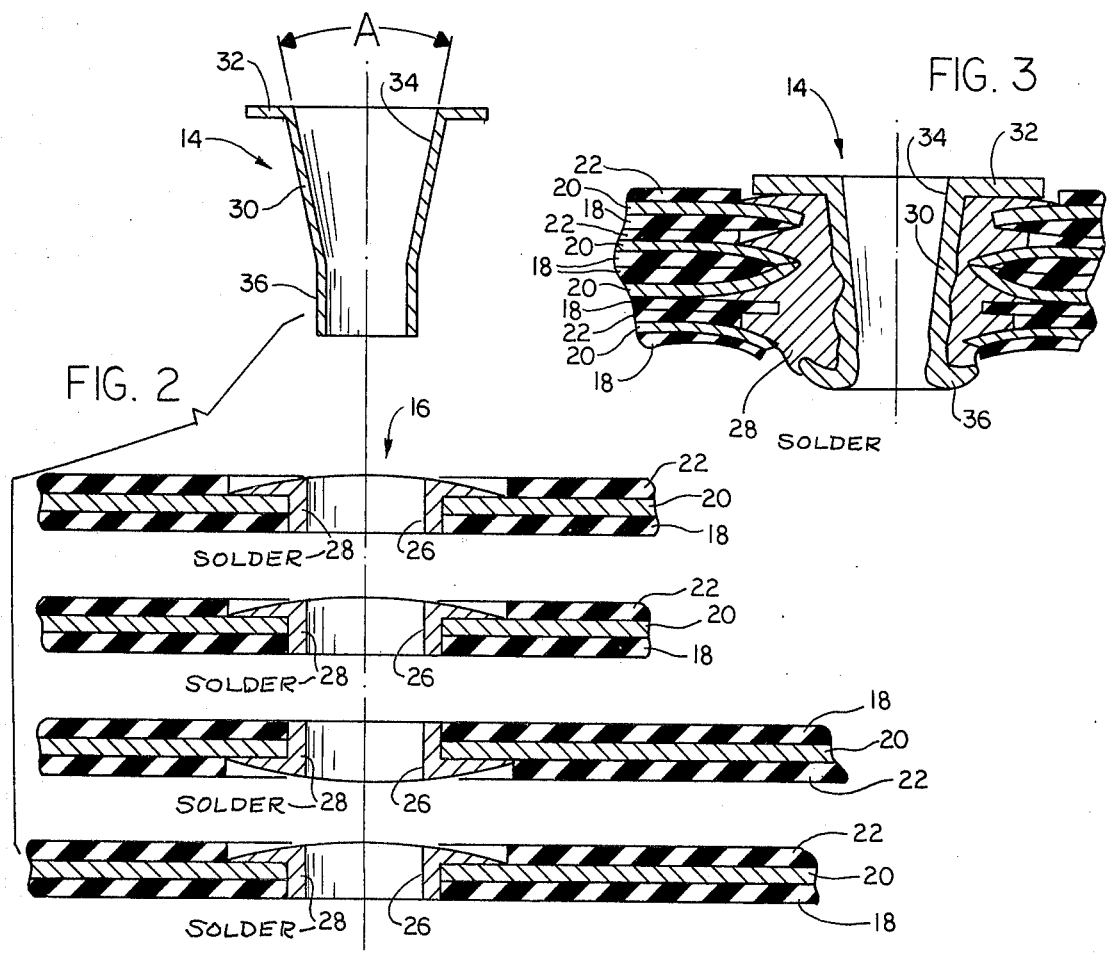
FIG. 2
FIG. 3

MULTILAYERED CIRCUIT ASSEMBLY INCLUDING AN EYELET FOR MAKING WELDABLE CONNECTIONS AND A METHOD OF MAKING SAID ASSEMBLY

BACKGROUND OF THE INVENTION

1. Field of the Invention

Present invention relates to multilayered circuit assemblies, a terminal for connecting said assembly together and a method of making said assembly.

2. Brief Description of the Prior Art

Flexible circuit and flat cables are well known in the art and have enjoyed a great deal of popularity owing to their ease of use and their ability to be employed in unusual space limitation situations. In the past, the main termination methods used of connecting flexible circuits and flat cables to other circuits has been soldering, mass bonding, crimping, pressure, and welding.

Typically, a flexible circuit generally includes a substrate having conductive means defining an electrical path of travel formed between a base layer made of insulation material and a cover layer made of insulation material. Each flexible circuit has an area that is defined as a connecting station whereat the conductive means of one flexible circuit can be electrically connected to a connecting station and, therefore, the conductive means of another flexible circuit.

A large number of flexible circuit elements of this type can be electrically connected to one another by forming a hole through the circuit elements and inserting an eyelet therethrough. When the eyelet is staked, a cold weld is intended to be formed between the eyelet and the conductive means of the layered flexible circuit elements.

Though the staking of cylindrical eyelets through holes in flexible circuit elements have proven to be satisfactory in some cases, problems have arisen with the consistency of the electrical connection. For example, it has been found that some of the connections formed in this manner become intermittent or do not form a good, reliable electrical connection with the respective conductive means of the different flexible circuit elements.

SUMMARY OF THE INVENTION

It is therefore a principal object of the present invention to provide a new and improved terminal in the form of an eyelet which is adapted to electrically connect a plurality of flat stacked circuit elements by insertion to overlying openings formed in conductive means of the circuit elements. The eyelet is unitary and includes a frusto-conical contact portion that contacts the conductive means, a circular stop flange formed around the base of the contact portion which defines the furthest insertion of the eyelet, and a generally hollow portion formed at the other end of the contact portion which is staked in a reverse curl fashion. The circuit elements are held together between the flange and the curled hollow portion.

It is another object of the present invention to provide a new and improved multilayered circuit assembly which includes a plurality of relatively flat circuit elements layered one atop another. Each circuit element has electrical conductive means and at least one connecting station associated with the conductive means. The connecting station includes an opening through the circuit elements so that a portion of the conductive means is electrically exposed through the opening. The assembly also includes a terminal which is receivable through the openings of the layered circuit elements for electrically connecting the connecting stations together. The improved terminal generally includes a unitary eyelet which has a frusto-conical contact portion which is adapted to be contacting the conductive means when the eyelet is inserted into the connecting station openings. A circular portion forms the base of the frustoconical contact portion with an annular stop flange which is adapted to seat relatively flat against the conductive means of one side of the circuit assembly when the eyelet if fully inserted. A generally hollow portion is formed at the other end of the contact portion and extends beyond the other side of the circuit assembly when the eyelet is fully inserted. The hollow portion is adapted to be staked in a reverse curl fashion so that the circuit elements are held together between the flange and the curled hollow portion so that the contact portion is cold welded to the conductive means.

Still another object of the present invention is to provide a new and improved method of making a multilayered circuit assembly from a plurality of flat, flexible circuit elements. Each circuit element generally includes a substrate having conductive means defining an electrical path of travel formed between a base layer made of insulation material and a cover layer made of insulation material. Each circuit element also has a connecting station associated with the conductive means. The new and improved method generally includes the steps of forming the conductive means on the base layer of each circuit element, punching a first opening through the conductive means and base layer at a connecting station of each circuit element, soldering the conecting station of each circuit element so that a solid solder pad fills said first opening whereby the solder electrically contacts the conductive means, punching a second opening through the cover layer of each element, securing the cover layer of each circuit element over the base layer and conductive means so that the first opening is generally concentric with the second opening, punching a third opening in each circuit element through the solder pad so that the third opening is smaller than and generally concentric with the first and second openings, the interior of the third opening being defined by the remaining solder, stacking a plurality of punched and soldered circuit elements on top of one another so that the third openings of each are generally concentric, inserting terminal means into the third openings of the stacked circuit elements so that a portion thereof contacts the solder, and staking the terminal means so that the outer surface thereof forms a cold weld interference fit against the solder.

BRIEF DESCRIPTION OF THE DRAWINGS

FIG. 1 is a perspective view of a multilayered circuit assembly of the present invention;

FIG. 2 is a side sectional exploded view of the circuit assembly of FIG. 1 showing the eyelet of the present invention;

FIG. 3 is a side sectional view of the circuit assembly of FIGS. 1 and 2 after the eyelet has been cold welded to the layered flexible circuit elements;

DESCRIPTION OF THE PREFERRED EMBODIMENTS

Figure 4:
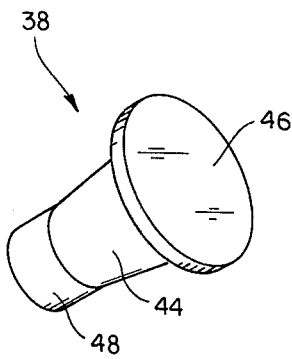
FIG. 4 is a perspective view of another form of the eyelet of the present invention.

Turning now to FIG. 1, the circuit assembly, generally designated 10, is seen to generally comprise a plurality of stacked, flat individual flexible circuit elements, generally designated 12. The circuit elements 12 are electrically connected to one another by means of an eyelet-type terminal, generally designated 14, which is inserted through and punched in a connecting station 16 of each circuit element 12.

Each circuit element 12 includes a substrate having a base layer 18 made of insulation material with conductive means 20 in the form of copper or the like formed thereover. A cover layer 22 made of insulation material is secured over the base layer 18 and conductive means 20 to form the completed flexible circuit element 12.

Suitable material such as polyester film can be used for the base layer 18 and the cover layer 22. The copper conductive means 20 is sufficiently thin so that the whole circuit element 12 is flexible.

The connecting station 16 of each circuit element 12 has an opening 26 formed therethrough which is lined in solder material 28. The eyelet 14 is adapted to be received through the opening 26 in a manner which will be described in greater detail hereinafter.

Turning now to FIG. 2, the eyelet 14 is seen to include an intermediate frusto-conical contact portion 30 which is adapted to contact the solder 28 when the eyelet is inserted into opening 26. A circular stop flange 32 is formed around the base of the contact portion 30 and defines the furthest insertion of the eyelet 14 in the opening 26 of the first circuit element 12. The stop flange 32 defines the periphery of an opening 34 in the eyelet 14.

A generally hollow cylindrical portion 36 is formed on the other end of the contact portion 30 and extends outside of the last circuit element 12. The hollow portion 36 is adapted to be staked in a reverse curl fashion so that the circuit elements 12 are held together between the stop flange 32 and the curled hollow portion 36. This results in a cold weld between the contact portion 30 and the solder 28, as best shown in FIG. 3, no matter how many circuit elements 12 are stacked.

The angle formed between opposite sides of the frusto-conical portion 30 (A in FIG. 2) varies depending on the number of circuit elements 12. This causes the best interference fit prior to being staked and also provides intimate contact for a good electrical connection after the staking operation.

The presence of the solder 28 between the contact portion 30 and the conductive means 20 provides an interface which aids in producing a good electrical connection. Were it not for the solder 28, the electrical contact would depend on the touching relationship between the contact portion 30 and the conductive means 20 directly. It has been found that, in some cases, the cover layer 22 or the base layer 18 would tend to interfere between the contact portion 30 and the conductive means 20 during and after the staking operation. The presence of the solder 28 eliminates this undesirable result.

Figure 5:
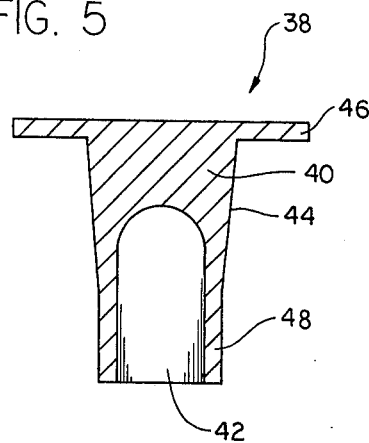
FIG. 5 is a side sectional view of the eyelet shown in FIG. 4.

FIGS. 4 and 5 show another configuration in which the eyelet of the present invention may be produced. FIGS. 4 and 5 show a cold headed terminal 38 having a top solid portion 40 and a lower hollow portion 42.

The terminal 38 has a frusto-conical contact portion 44 having a circular stop flange 46 formed around the base thereof and a cylindrical hollow portion 48 formed on the other side of the contact portion 44. Portions 44, 46 and 48 serve the same purposes as portions 30, 32 and 36, respectively, in the eyelet 14 already described.

Figure 6:
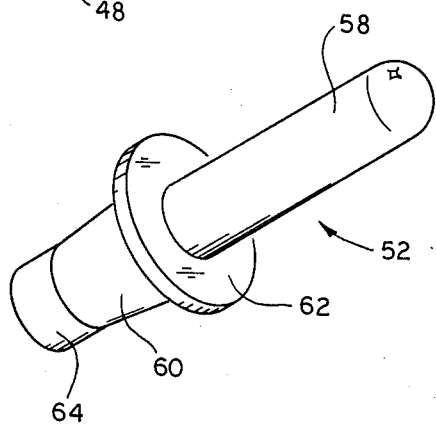
FIG. 6 is a perspective view of still another form of an eyelet of the present invention.

Still another form of the terminal of the present invention is shown in FIG. 6. A male pin terminal 52 is shown with a male pin portion 58 extending from the top thereof.

Terminal 52 also has a frusto-conical contact portion 60 with a circular stop flange 62 formed on the base thereof and a hollow cylindrical portion 64 formed on the other end of the contact portion 60. Portions 66, 62 and 64 serve the same purposes as portions 30, 32 and 36, respectively, do with respect to eyelet 14. By using terminal 52, a circuit assembly can be mated to another circuit assembly having a female terminal interconnecting the second circuit assembly.

Figure 7A:
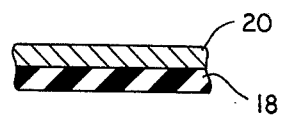
FIGS. 7A-I are side sectional views illustrating the method by which the circuit assembly of the present invention is produced.
Figure 7B:
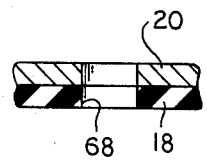

In order to manufacture the circuit assembly 10 above described, the conductive means 20 is first formed on the base layer 18 of each circuit element 12 as seen in FIG. 7A. A first opening 68 is then punched through the conductive means 20 and the base layer 18 at a connecting station 16 of each circuit element 12 as best shown in FIG. 7B.

Figure 7C:
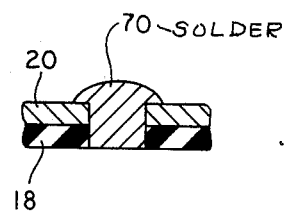

Each circuit element 12 as defined by the punched base layer 18 and conductive means 20, is then wave-soldered. The wave-solder operation produces a solid solder pad 70 which completely fills opening 68 as shown in FIG. 7C. The solder material intimately contacts the conductive means 20.

Figure 7D:
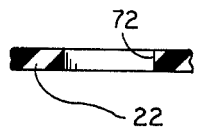
Figure 7E:
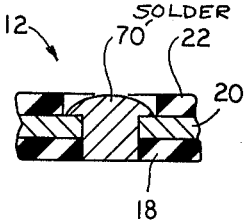

The cover layer 22 is punched with a second opening 72 which is larger than the solder pad 70 as shown in FIG. 7D. The prepunched cover layer 22 of each circuit element 12 is then secured over the base layer 18 and conductive means 20 so that the opening 68 is generally concentric with the opening 72 as best shown in FIG. 7E.

Figure 7F:
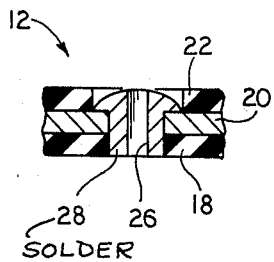

Opening 26 is then punched in each circuit element 12 through the solder pad 70 as shown in FIG. 7F. Opening 26 is smaller than and generally concentric with openings 68 and 72. The interior of opening 26 is defined by the solder material 28.

Figure 7G:
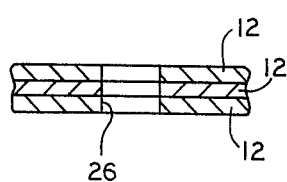
Figure 7H:
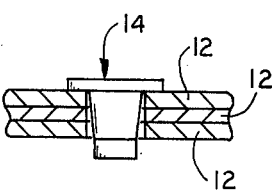

At this point, a plurality of punched and soldered circuit elements 12 (as shown in FIG. 7F) are stacked one on top of another so that the openings 26 are concentric with respect to one another as shown in FIG. 7G. The eyelet terminal 14 is then inserted into the openings 26 of the stacked circuit elements 12 so that the contact portion 30 contacts the solder 28 as shown in FIG. 7H.

Figure 7I:
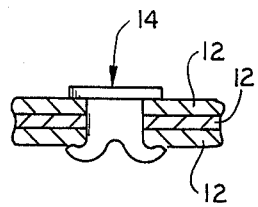

Finally, the eyelet 14 is then staked in a reverse curl fashion so that the contact portion 30 forms a cold weld interference fit against the solder 28. The stack circuit elements 12 are held between the stop flange 32 and the curled hollow portion 36 as shown in FIG. 7I and FIG. 3.

I claim:

1. A method of making a multilayered circuit assembly from a plurality of flat, flexible circuit elements, each circuit element including a substrate having conductive means defining an electrical path of travel formed between a base layer made of insulation material and a cover layer made of insulation material, each circuit element having a connecting station associated with the conductive means, said method comprising the steps of:

forming the conductive means on the base layer of each circuit element;

punching a first opening through said conductive means and base layer at a connecting station of each circuit element;

soldering the connecting station of each circuit element so that a solid solder pad fills said first opening whereby said solder electrically contacts said conductive means;

punching a second opening through the cover layer of each circuit element;

securing the cover layer of each circuit element over the base layer and conductive means so that said first opening is generally concentric with said second opening;

punching a third opening in each circuit element through said solder pad, said third opening being smaller than and generally concentric with said first and second openings, the interior of said third opening being defined by the remaining solder;

stacking a plurality of punched and soldered circuit elements on top of one another so that the third openings of each are generally concentric;

inserting terminal means into the third openings of the stacked circuit elements so that a portion thereof contacts the solder; and staking said terminal means so that the outer surface thereof forms a cold weld interference fit against the solder.

2. The method of claim 1 wherein said second opening is larger than said first opening.

3. The method of claim 1 wherein the portion of said terminal means which contacts the solder is generally conical in configuration.

4. The method of claim 1 wherein said staking step includes reverse curling a portion of said terminal back against said circuit assembly.

* * * * *